(12) United States Patent
Wang et al.

(10) Patent No.: US 7,585,548 B2
(45) Date of Patent: Sep. 8, 2009

(54) INTEGRATED COMPOUND NANO PROBE CARD AND METHOD OF MAKING SAME

(75) Inventors: Horng-Jee Wang, Taipei (TW); Ya-Ru Huang, Taipei (TW); Min-Chieh Chou, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/071,310

(22) Filed: Feb. 20, 2008

(65) Prior Publication Data

US 2008/0160195 A1 Jul. 3, 2008

Related U.S. Application Data

(62) Division of application No. 10/393,262, filed on Mar. 21, 2003, now Pat. No. 7,400,159.

(30) Foreign Application Priority Data

Nov. 29, 2002 (TW) ............................... 91134713 A

(51) Int. Cl.
*B05D 5/00* (2006.01)
(52) U.S. Cl. .................. 427/256; 977/742; 324/761
(58) Field of Classification Search .............. None
See application file for complete search history.

(56) References Cited

U.S. PATENT DOCUMENTS

| 5,571,148 | A | 11/1996 | Loeb et al. |
|---|---|---|---|
| 5,903,161 | A * | 5/1999 | Amemiya et al. ........... 324/754 |
| 6,129,901 | A | 10/2000 | Moskovits et al. |
| 6,188,582 | B1 | 2/2001 | Peter |
| 6,232,706 | B1 | 5/2001 | Dai et al. |
| 6,340,822 | B1 | 1/2002 | Brown et al. |
| 6,346,023 | B1 | 2/2002 | Tsuboi et al. |
| 6,383,923 | B1 | 5/2002 | Brown et al. |
| 6,401,526 | B1 | 6/2002 | Dai et al. |
| 6,682,383 | B2 | 1/2004 | Cho et al. |
| 6,689,439 | B2 | 2/2004 | Sobolewski |
| 6,692,327 | B1 | 2/2004 | Deguchi et al. |
| 6,727,720 | B2 | 4/2004 | Houge et al. |
| 6,741,019 | B1 | 5/2004 | Filas et al. |
| 6,821,625 | B2 | 11/2004 | Chu et al. |
| 6,831,017 | B1 | 12/2004 | Li et al. |
| 6,855,603 | B2 | 2/2005 | Choi et al. |
| 6,864,162 | B2 | 3/2005 | Jin |
| 6,884,707 | B1 | 4/2005 | Cherian |
| 6,989,325 | B2 | 1/2006 | Uang et al. |
| 7,012,441 | B2 | 3/2006 | Chou et al. |
| 2004/0072994 | A1 | 4/2004 | Herr et al. |
| 2006/0290343 | A1 | 12/2006 | Crafts et al. |

* cited by examiner

*Primary Examiner*—Shamim Ahmed
(74) *Attorney, Agent, or Firm*—Bacon & Thomas PLLC

(57) ABSTRACT

An integrated compound nano probe card is disclosed to include a substrate layer having a front side and a back side, and compound probe pins arranged in the substrate layer. Each compound probe pin has a bundle of aligned parallel nanotubes/nanorods and a bonding material bonded to the bundle of aligned parallel nanotubes/nanorods and filled in gaps in the nanotubes/nanorods. Each compound probe pin has a base end exposed on the back side of the substrate layer and a distal end spaced above the front side of the substrate layer.

17 Claims, 4 Drawing Sheets

INTEGRATED COMPOUND NANO PROBE CARD AND METHOD OF MAKING SAME

CROSS-REFERENCE TO RELATED APPLICATIONS

This application is a divisional of patent application Ser. No. 10/393,262 filed Mar. 21, 2003 now U.S. Pat. No. 7,400,159 B2.

BACKGROUND OF THE INVENTION

1. Field of the Invention

The present invention relates generally to a probe card for testing electronic elements and its fabrication method and, more specifically, to an integrated compound nano probe card. The invention relates also to the fabrication of the integrated compound nano probe card.

2. Description of the Related Art

A variety of probe cards for testing electrical properties of an electronic element are commercially available. These probe cards include two types, i.e., the cantilever type and the vertical type. The probe pins of these two types of probe cards are tungsten pins, lead pins, or beryllium copper pins manually installed in a printed circuit board. The pitch of the probe pins of a cantilever type probe card is about 50 µm. The pitch of the probe pins of a vertical type probe card is about 100 µm. Due to technical limitations, the pitch of the probe pins of either type of probe cards cannot be reduced as desired to fit measuring requirements for nanoelectronics. Further, because probe pins are installed in a printed circuit board manually, the manufacturing cost is relatively increased with the increasing of pin counts. This drawback causes the aforesaid conventional probe cards unable to meet future demand.

U.S. Pat. No. 6,232,706 discloses a field emission device having bundles of aligned parallel carbon nanotubes on a substrate. The carbon nanotubes are oriented perpendicular to the substrate. The bundles of carbon nanotubes extend only from regions of the substrate patterned with a catalyst material. The substrate is porous silicon. The fabrication of the field emission device starts with forming a porous layer on a silicon substrate by electrochemical etching. Then, a thin layer of iron is deposited on the porous layer in patterned regions. The iron is then oxidized into iron oxide, and then the substrate is exposed to ethylene gas at elevated temperature. The iron oxide catalyzes the formation of bundles of aligned parallel carbon nanotubes, which grow perpendicular to the substrate surface.

The advantages of U.S. Pat. No. 6,232,706 include (1) small nanotube pitch, and (2) manufacturing cost of nanotubes being not determined subject to the pin counts. However, this design still has drawbacks. Because nanotubes are not linked to one another, the whole structure is bulky, resulting in low physical and electrical properties of nanotubes. Further, due to low impact strength of carbon material, nanotubes tend to be broken when pressed by an external object. Due to the aforesaid drawbacks, nanotubes made according to U.S. Pat. No. 6,232,706 are not suitable for use as probe pins in a probe card.

Further, U.S. Pat. No. 5,903,161 discloses an electrically conductive rod-shaped single crystal product, which is a rod-shaped single crystal formed by a vapor-liquid-solid method or such a rod-shaped single crystal having its forward end alloy portion removed, and the surface of the rod-shaped single crystal is coated by an electrically conductive film. However, this rod-shaped single crystal product has a low electric conductivity due to its limited electric conducting area.

SUMMARY OF THE INVENTION

The present invention has been accomplished under the circumstances in view. It is therefore the main object of the present invention to provide a compound probe pin, which has good physical properties as well as good electrical properties. To achieve this object, the compound probe pin comprises a bundle of aligned parallel nanotubes/nanorods, and a bonding material bonded to the bundle of aligned parallel nanotubes/nanorods and filled in gaps in the nanotubes/nanorods.

It is another object of the present invention to provide a probe card having integrated compound nano probe pins, which has a small probe pin pitch and is inexpensive to manufacture. To achieve this object, the probe card comprises a substrate layer having a front side and a back side, and compound probe pins arranged in the substrate layer. Each compound probe pin is comprised of a bundle of aligned parallel nanotubes/nanorods, and a bonding material bonded to the bundle of aligned parallel nanotubes/nanorods and filled in gaps in the nanotubes/nanorods. Each compound probe pin has a base end exposed to the outside of the back side of the substrate layer, and a distal end spaced above the front side of the substrate layer.

It is still another object of the present invention to provide a probe card fabrication method, which minimizes the pitch of probe pins, improves the physical and electrical properties of probe pins, and increases pin accounts without increasing much manufacturing cost. To achieve this object, the probe card fabrication method comprises the steps of (1) preparing a substrate having a porous surface; (2) covering a catalyst material on the porous surface of the substrate subject to a predetermined pattern, so as to form a plurality of catalyst strips on the porous surface of the substrate, the catalyst strips each comprising a plurality of catalyst elements; (3) exposing the catalyst strips to an environment containing a predetermined gas and having a temperature above room temperature, for enabling the catalyst elements to react with the gas so as to form bundles of aligned parallel nanotubes/nanorods at the catalyst strips; and (4) covering the bundles of aligned parallel nanotubes/nanorods by a bonding material, enabling the bonding material to pass into gaps in the aligned parallel nanotubes/nanorods.

DETAILED DESCRIPTION OF THE INVENTION

Figure 1:
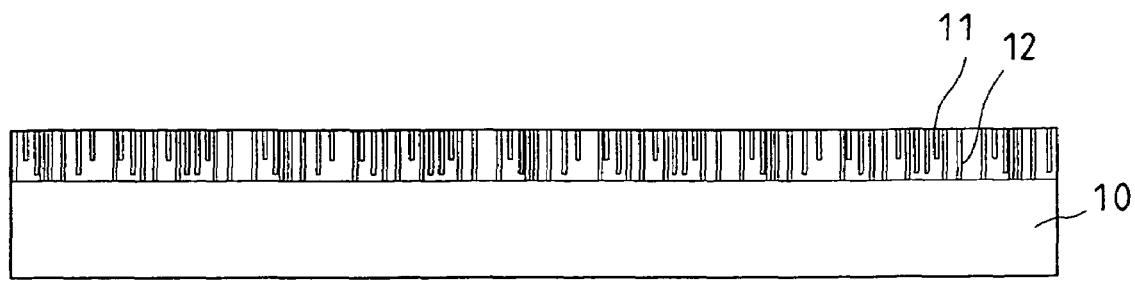
FIG. 1 is a sectional view of a finished product obtained after step (1) of the probe card fabrication method according to the present invention.

Referring to FIGS. 1~4, a probe card fabrication method includes the steps of:

(1) Prepare a p-doped n+-type si(100) substrate 10, then use hydrofluoric acid solution and platinum served as a cathode to electrochemically etch one surface 11 of the substrate 10, forming pores 12 in the surface 11, each pore 12 having a diameter below 3 nm, as shown in FIG. 1.

Figure 2:
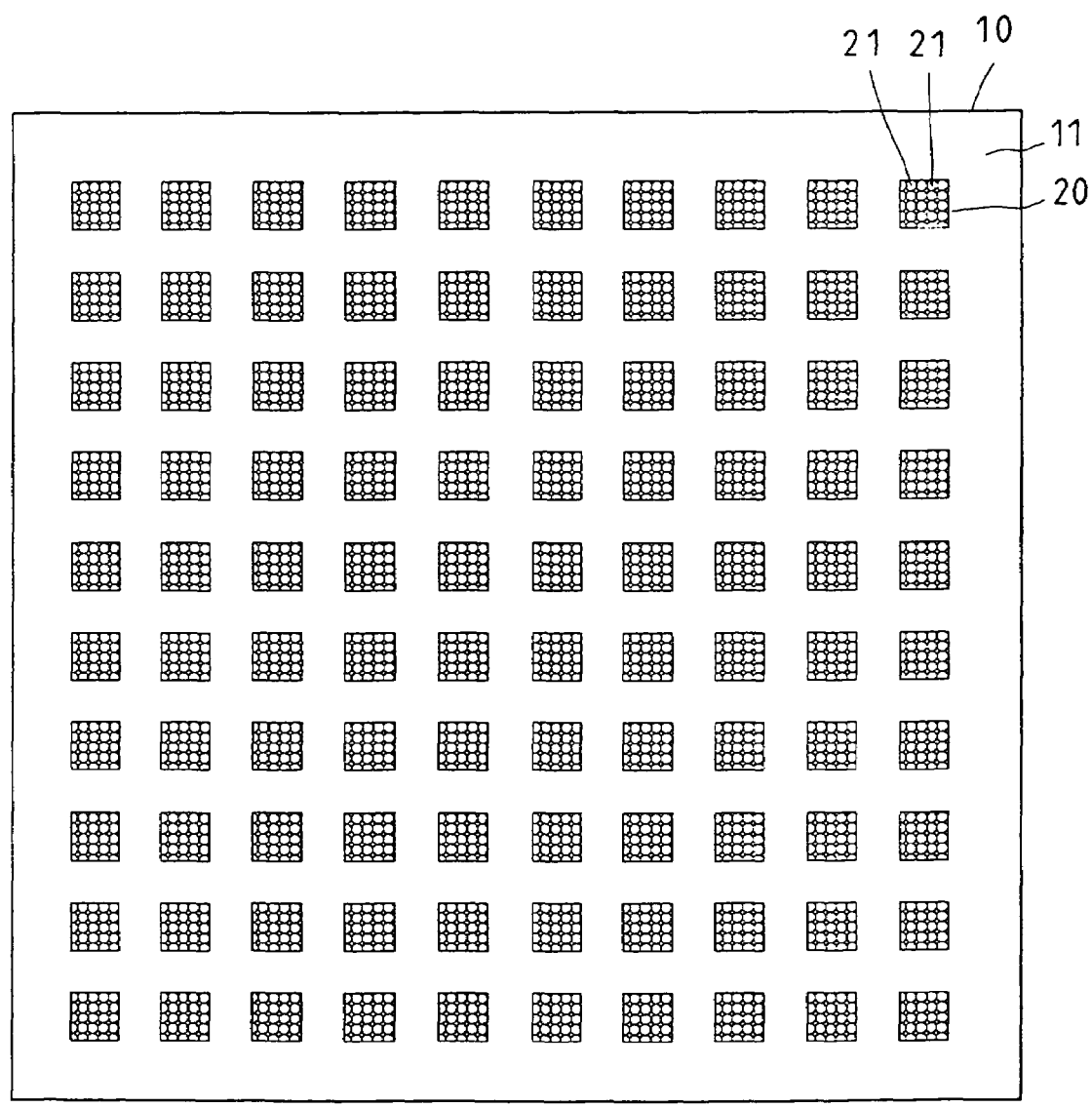
FIG. 2 is a top view of a finished product obtained after step (2) of the probe card fabrication method according to the present invention.

(2) Use lithography and evaporation techniques to cover a catalyst material, for example, iron (Fe), on the surface 11, forming a matrix of catalyst strips 20 on the surface 11, each catalyst strips 20 having densely arranged fine catalyst elements 21, as shown in FIG. 2.

Figure 3:
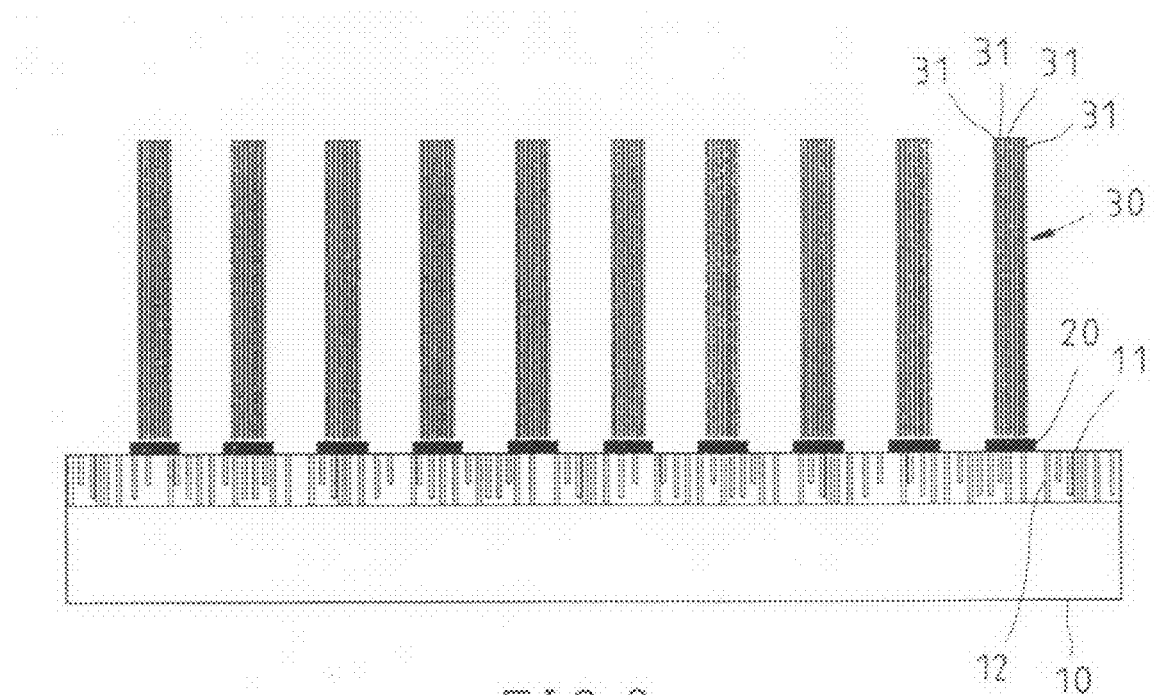
FIG. 3 is a sectional view of a finished product obtained after step (3) of the probe card fabrication method according to the present invention.

(3) Put the substrate 10 in a CVD (chemical vapor deposition) stove pipe, then increase the temperature in the stove pipe properly and supply a carbon-contained gas, for example, $C_2H_2$, causing the catalyst elements 21 to make a chemical reaction with the supplied gas, so that bundles 30 of aligned parallel carbon nanotubes 31 are crystallized and respectively formed in the catalyst strips 20 and extended in direction substantially perpendicular to the surface 11 of the substrate 10, as shown in FIG. 3.

Figure 4:
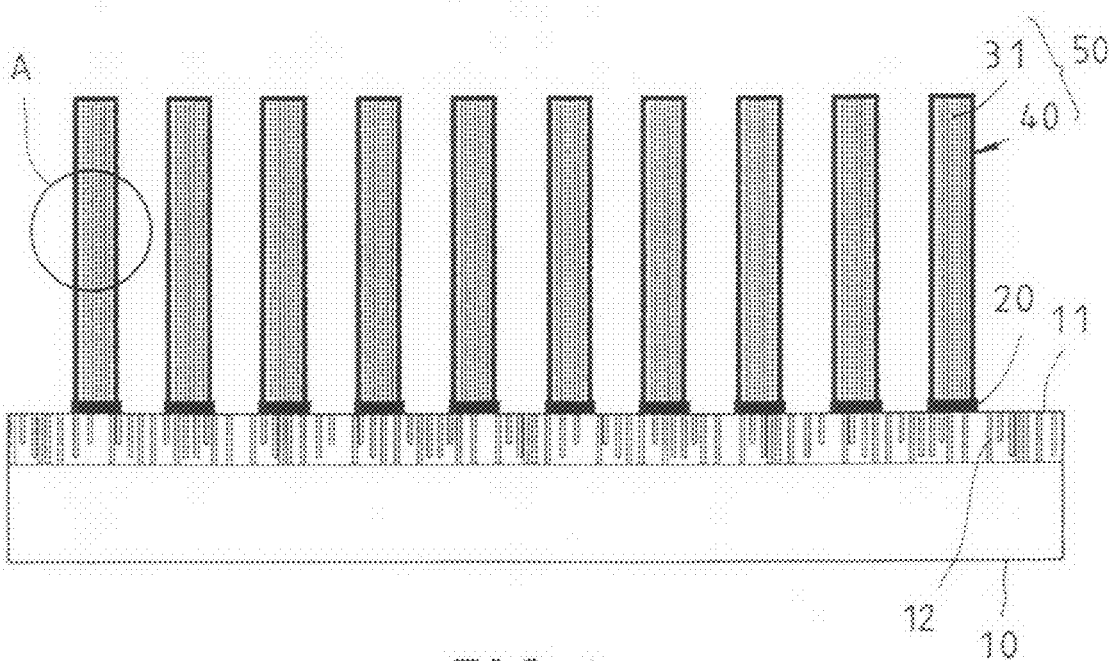
FIG. 4 is a sectional view of a finished product obtained after step (4) of the probe card fabrication method according to the present invention.

(4) Cover the bundles 30 by a bonding material, for enabling the applied bonding material to pass into gaps in carbon nanotubes 31. According to this embodiment, a metal material of good electrical properties and mechanical properties, for example, copper 40 is covered on the bundles 30 by electroplating, enabling copper 40 to pass into gaps in carbon nanotubes 31 of each bundle 30, forming compound probe pins 50 on the substrate 10, as shown in FIG. 4.

Figure 5:
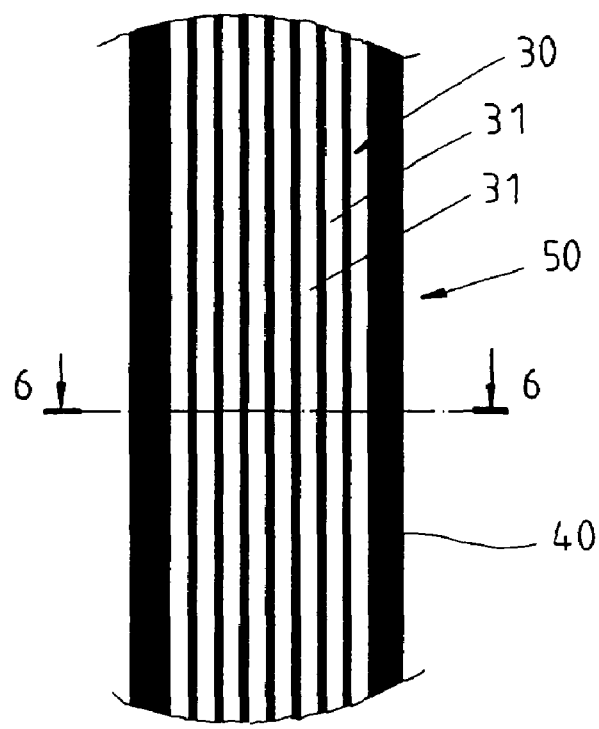
FIG. 5 is an enlarged view of part A of FIG. 4.
Figure 6:
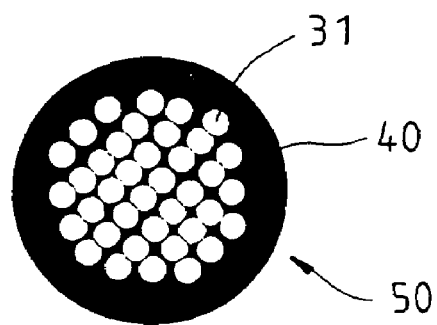
FIG. 6 is a sectional view taken along line 6-6 of FIG. 5.

With reference to FIGS. 5 and 6, the compound probe pin 50 made subject to the aforesaid method comprises a bundle 30 of substantially aligned parallel carbon nanotubes 31 and a metal material 40 covered on the bundle 30 (see FIG. 5) and filled up the gaps in the carbon nanotubes 31 (see FIG. 6). Because the bundle 30 is covered by the metal material 40 and the carbon nanotubes 31 are fixedly fastened to one another by the metal material 40, the compound probe pin 50 has a dense structure, and good mechanical, physical and electrical properties.

After the aforesaid four steps, each compound probe pin 50 has a base end and a distal end. The base end is fixedly connected to the surface 11 of the substrate 10 by one catalyst strip 20.

Figure 7:
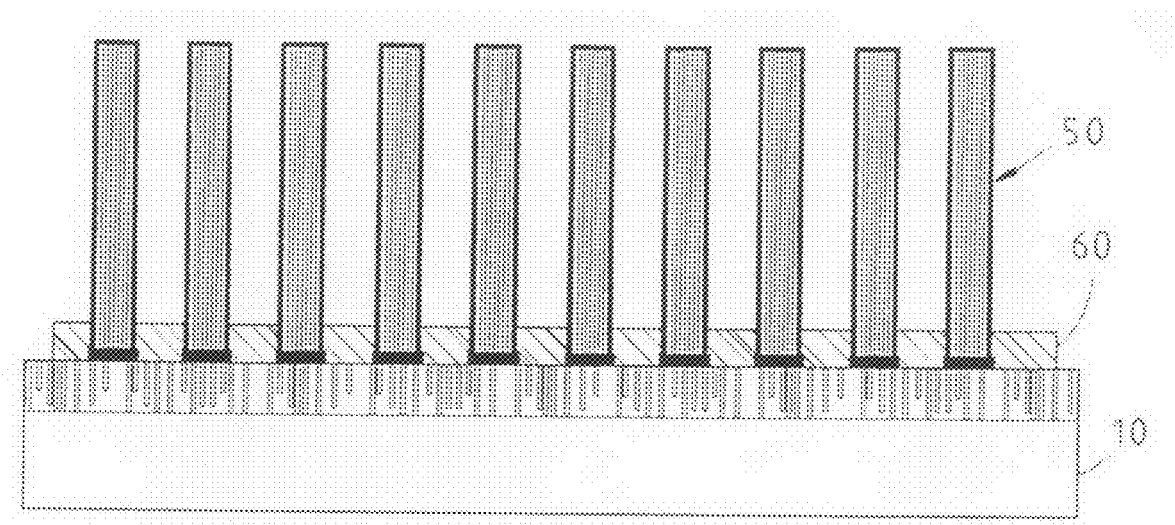
FIG. 7 is a sectional view of a finished product obtained after step (5) of the probe card fabrication method according to the present invention.
Figure 8:
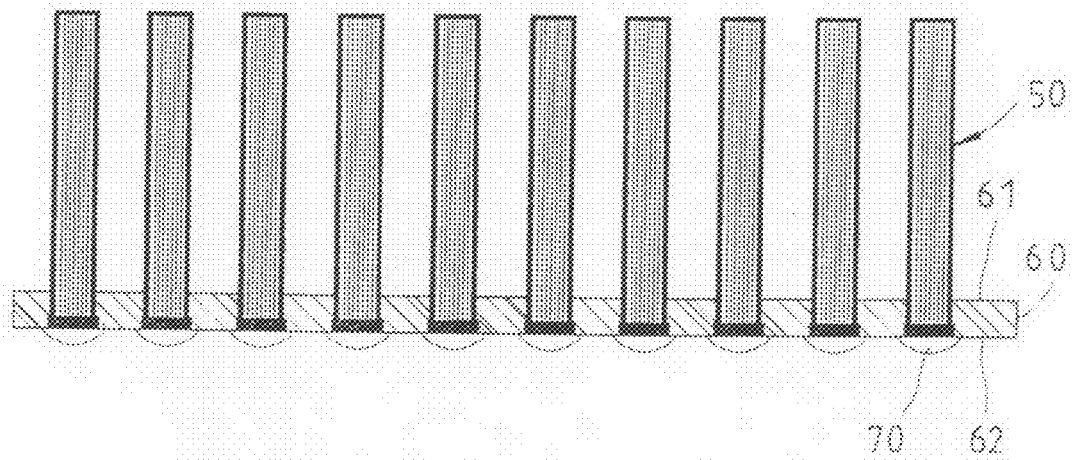
FIG. 8 is a sectional view of a finished product obtained after step (6) of the probe card fabrication method according to the present invention.

With reference to FIGS. 7 and 8, after the aforesaid four steps, it proceeds to the following steps:

(5) Apply a layer of liquid epoxy resin to the surface 11 of the substrate 10, enabling the layer of liquid epoxy resin to cover the base ends of the compound probe pins 50 and to form a substrate layer 60 when hardened as shown in FIG. 7.

(6) Remove the substrate 10 from the substrate layer 60. At this time, the substrate layer 60 has a front side 61 and a back side 62, the base ends of the compound nano probe pins 50 are exposed out of the back side 62 of the substrate layer 60, and the distal ends of the compound nano probe pins 50 are spaced above the front side 61 of the substrate layer 60. A metal conducting block 70 is then respectively formed in the exposed base end of each compound nano probe pin 50 for connection either directly or indirectly to a printed circuit board, forming a probe card.

As indicated above, the invention uses nanotechnology to form multiple compound probe pins at a time, so that the pitch of probe pins can be greatly reduced. A probe card made according to the present invention is suitable for measuring electrical properties of nanoelectronic elements. Because multiple compound probe pins are formed at a time, it breaks the limitation that the manufacturing cost is directly proportional to pin counts, and the manufacturing cost is greatly lowered. Because compound probe pins made according to the present invention have a good structure, they provide good mechanical, physical and electrical properties.

In the aforesaid fabrication procedure, iron (Fe) and $C_2H_2$ are respectively used in step (2) and step (3). Other suitable metal materials and gases may be used. For example, when gold (Au) is used as a catalyst material, $SiCl_4+H_2$ is supplied to the stove pipe, causing formation of bundles of aligned parallel silicon nanorods, which grow perpendicular to the substrate surface.

Further, arc-discharge or laser evaporation may be used to substitute for chemical vapor deposition.

The material for bonding nanotubes/nanorods can be selected from gold, nickel, nickel alloy, silver, tungsten alloy, copper, or beryllium. Because carbon nanotubes have good electric conductivity, insulating material, for example, rubber may be used and covered on the periphery of each bundle of carbon nanotubes, leaving the top end of each bundle of carbon nanotubes exposed to the outside for electric connection.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A nano probe pin fabrication method comprising the steps of:
    (1) preparing a substrate having a porous surface;
    (2) covering a catalyst material on the porous surface of said substrate subject to a predetermined pattern, so as to form a plurality of catalyst strips on the porous surface of said substrate, said catalyst strips each having a plurality of catalyst elements;
    (3) exposing said catalyst strips to an environment containing a predetermined gas and having a temperature above room temperature, for enabling said catalyst elements to react with said gas so as to form bundles of aligned parallel nanotubes/nanorods at said catalyst strips; and
    (4) covering said bundles of aligned parallel nanotubes/nanorods by a bonding material, enabling said bonding material to fill up gaps in between the said aligned parallel nanotubes/nanorods.

2. The nano probe pin fabrication method as claimed in claim 1, wherein said substrate having a porous surface prepared during said step (1) is obtained by preparing a p-doped n+-type si (100) substrate, and then using hydrofluoric acid solution and platinum served as a cathode to electrochemically etch one surface of said p-doped n+-type si (100) substrate, forming pores in the surface of said p-doped n+-type si (100) substrate, said pores having diameters below 3 nm.

3. The nano probe pin fabrication method as claimed in claim 1, wherein the catalyst material used in said step (2) is iron (Fe), and the gas used in said step (3) is $C_2H_2$.

4. The nano probe pin fabrication method as claimed in claim 3, wherein said catalyst material is covered on the porous surface of said substrate by lithography and evaporation in the form of a matrix.

5. The nano probe pin fabrication method as claimed in claim 1, wherein said step (3) is achieved by putting said substrate in a CVD (chemical vapor deposition) stove pipe, and then supplying $C_2H_2$ to said CVD stove pipe when increasing the temperature in said CVD stove pipe, for enabling said catalyst elements to make a chemical reaction with $C_2H_2$, so that bundles of aligned parallel carbon nanotubes are crystallized and respectively formed at said catalyst strips and extended in a direction substantially perpendicular to the porous surface of said substrate.

6. The nano probe pin fabrication method as claimed in claim 1, wherein said bonding material used during step (4) is a metal material.

7. The nano probe pin fabrication method as claimed in claim 1, wherein said bonding material used during said step (4) is copper.

8. The nano probe pin fabrication method as claimed in claim 1, wherein said bonding material used during said step (4) is an electrically insulating material.

9. The nano probe pin fabrication method as claimed in claim 1, wherein said bonding material used during said step (4) is rubber.

10. The nano probe pin fabrication method as claimed in claim 6, wherein the metal material used for said bonding material during said step (4) is electroplated on said bundles of aligned parallel nanotubes/nanorods.

11. The nano probe pin fabrication method as claimed in claim 10, wherein the metal covered on said bundles of aligned parallel nanotubes/nanorods during said step (4) fills up gaps in aligned parallel nanotubes/nanorods of said bundles of aligned parallel nanotubes/nanorods.

12. The nano probe pin fabrication method as claimed in claim 9, wherein the rubber used for said bonding material during said step (4) is covered on the periphery of said bundles of aligned parallel nanotubes/nanorods and passed into gaps aligned parallel nanotubes/nanorods of said bundles of aligned parallel nanotubes/nanorods, leaving a top end of each of said bundles of aligned parallel nanotubes/nanorods exposed to the outside for electric connection.

13. The nano probe pin fabrication method as claimed in claim 1 further comprising the step of:
  (5) applying a layer of liquid epoxy resin to the porous surface of said substrate, enabling said layer of liquid epoxy resin to cover base ends of said bundles of aligned parallel nanotubes/nanorods and to form a substrate layer when hardened, and
  (6) removing said substrate from said substrate layer such that the base end of each of the bundles of nanotubes/nanorods is exposed on a back side of said substrate layer, and then forming a respective metal conducting block on the exposed base end of each of the bundles of nanotubes/nanorods.

14. The nano probe pin fabrication method as claimed in claim 1 wherein said step (3) is achieved by arc-discharge or laser evaporation.

15. The nano probe pin fabrication method as claimed in claim 1 wherein the material for bonding nanotubes/nanorods is selected from gold, nickel, nickel alloy, silver, tungsten alloy, copper or beryllium.

16. The nano probe pin fabrication method as claimed in claim 1, wherein the catalyst material used in said step (2) is gold (Au), and the gas used in said step (3) is $SiCl_4+H_2$.

17. A nano probe pin fabrication method comprising the steps of:
  (1) preparing a substrate having a porous surface;
  (2) covering a catalyst material on the porous surface of said substrate subject to a predetermined pattern, so as to form a plurality of catalyst strips on the porous surface of said substrate, said catalyst strips each having a plurality of catalyst elements;
  (3) exposing said catalyst strips to an environment containing a predetermined gas and having a temperature above room temperature, for enabling said catalyst elements to react with said gas so as to form bundles of aligned parallel nanotubes/nanorods at said catalyst strips; and
  (4) covering said bundles of aligned parallel nanotubes/nanorods by a bonding material, enabling said bonding material to fill up gaps in between the said aligned parallel nanotubes/nanorods wherein a rubber used for said bonding material during said step (4) is covered on the periphery of said bundles of aligned parallel nanotubes/nanorods and passed into gaps aligned parallel nanotubes/nanorods of said bundles of aligned parallel nanotubes/nanorods, leaving a top end of each of said bundles of aligned parallel nanotubes/nanorods exposed to the outside for electric connection.

* * * * *